(12) United States Patent
Kang et al.

(10) Patent No.: US 6,355,502 B1
(45) Date of Patent: Mar. 12, 2002

(54) SEMICONDUCTOR PACKAGE AND METHOD FOR MAKING THE SAME

(75) Inventors: Kun-A Kang; Hyung J. Park; J. H. Lee, all of Kyunggi-Do (KR)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/557,344

(22) Filed: Apr. 25, 2000

(51) Int. Cl.[7] .......................... H01L 21/44; H01L 21/48; H01L 21/50

(52) U.S. Cl. ........................ 438/110; 438/106; 438/111; 438/123

(58) Field of Search ................................ 438/106, 110, 438/111, 119, 123, 124, 126

(56) References Cited

U.S. PATENT DOCUMENTS 5,885,852 A  * 3/1999 Kishikawa et al.
6,177,719 B1 * 1/2001 Huang et al.

* cited by examiner

Primary Examiner—Kevin M. Picardat
Assistant Examiner—D. M. Collins
(74) Attorney, Agent, or Firm—Jiawei Huang; J.C. Patents (57) ABSTRACT

A method for making a semiconductor package firstly provides a lead frame having a first surface and a corresponding second surface. The lead frame includes at least a package unit that further includes a die pad, and a plurality of leads disposed on the periphery of the die pad where each of the leads further includes a neck portion. The method then attaches the second surface of the lead frame to a tape, and performs a punching process to cut off the neck portion of the lead so as to form a plurality of conductive blocks disposed independently on the periphery of the die pad. The method further provides a chip having its back surface attach to the first surface of the die pad, and provides electrical connection between the bonding pad and the first surface of the conductive block by using a plurality of bonding wires. Further, the method performs an encapsulating process to encapsulate the chip, the bonding wires, the die pad, and the first surface of the conductive block. The method then performs a singulating process to separate the package unit from the lead frame. Finally the method performs a detaping process to expose the die pad and the second surface of the conductive block.

20 Claims, 9 Drawing Sheets

SEMICONDUCTOR PACKAGE AND METHOD FOR MAKING THE SAME

BACKGROUND OF THE INVENTION

1. Field of the Invention

This invention relates to a method for making a semiconductor package, and more particularly to a method for making a semiconductor package and its carrier structure.

2. Description of Related Art

As far as the development of integrated circuit technology is concerned, not only it is heading for ever high integration in the front-end process, but it is also in pursuit of a package with ever high density in the back-end process of the semiconductor industry. The Chip Scale Package (CSP) which is actively developed and manufactured by the industry nowadays has its package size only slightly larger than that of the chip. Therefore, the CSP not only can save a lot of space, but since the signal transmission path is shorten, the CSP can also increase the efficacy of the product. The carrier employed by the CSP includes a lead frame, a flexible substrate, and a rigid substrate etc. Moreover, the lead frame having the advantage of low in cost and easy in working becomes a popular CSP package type in the consumer electronic products. For instance, the popular lead frame based CSPs are Quad Flat Nolead (QFN) Package developed by Matsusita, Micro Lead Frame Package (MLP) developed by Amkor, and Bottom Leaded Package (BLP) developed by LG electronics etc. In addition, the leadless type of CSP having the advantages of shortening the signal transmission path and lowering the signal attenuation is always a popular package structure of the low pin count semiconductor device.

Figure 1:
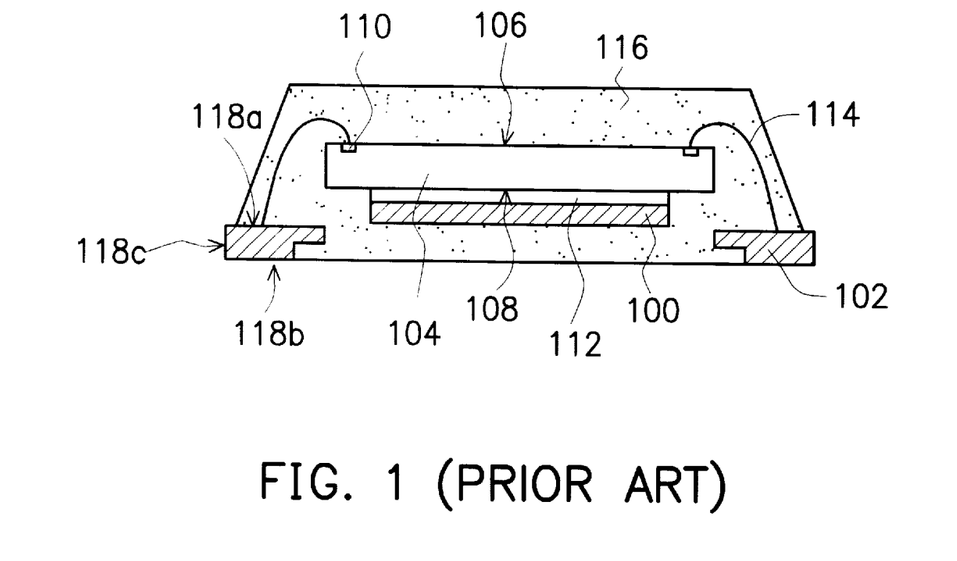
FIG. 1 is a cross-sectional view of a quad flat semiconductor package according to a prior art.
Figure 2:
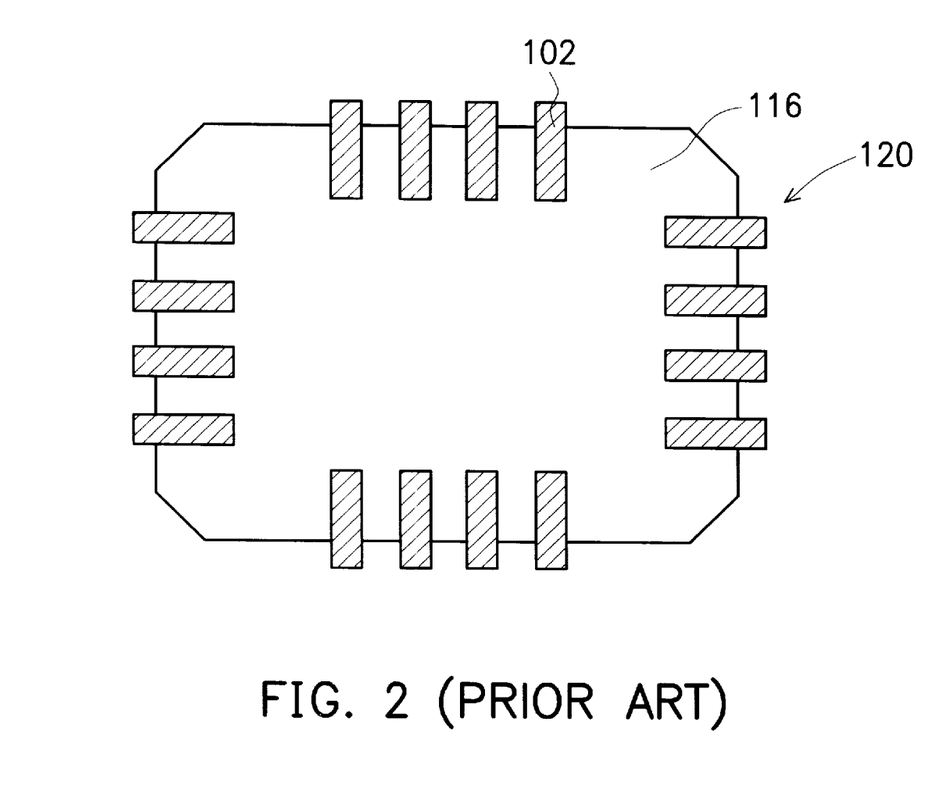
FIG. 2 is a top view of the quad flat semiconductor package of FIG. 1 according to a prior art.

FIG. 1 is a cross-sectional view of a QFN package according to a prior art, and FIG. 2 is a top view of the QFN package in FIG. 1. The technology of QFN package structure has been disclosed in U.S. Pat. No. 5,942,794 (Matsushita, 1999). The QFN package structure 120 is constructed on a lead frame that includes a die pad 100 and a plurality of leads 102. The leads 102 having an upper surface 118a, a lower surface 118b, and a side surface 118c are disposed on the periphery of the die pad 100. A chip 104 having an active surface 106 and a back surface 108 is attached to the die pad 100 by the back surface 108 with an adhesive 112. A plurality of bonding pads 110 built on the active surface 106 and served as the external connections of the chip 104 is electrically connected to the leads 102 by the bonding wires 114. A molding compound 116 is then used to encapsulates the chip 104, the die pad 100, the bonding wire 114, and the upper surface 118a of the lead 102 while to expose the lower surface 118b and the side surface 118c of the lead 102 to serve as the external connections of the whole package 120. A singulating process is then performed to separate the packages from the lead frame after the encapsulating process is accomplished.

The singulating process either using the sawing process or the punching process for the lead frame type semiconductor package disregarding whether it is a QGN, a MLP, or a BLP as mentioned above will directly impact the outer lead portion (not shown) of the lead 102. This impact not only results in the shortening in the service life of the facilities, the impairing of the products' integrity, but also the delaminating between the leads 102 and the molding compound 116. Consequently, the moisture sensitivity level of the products is deteriorated and the reliability of the products is affected.

SUMMARY OF THE INVENTION

The invention is directed to an improved semiconductor package process that can improve the product's integrity.

The invention is also directed to an improved semiconductor package process that can prolong the product's service life and can facilitate the mass production of the product.

The invention is further directed to an improved semiconductor package process that can increase the reliability of the product.

In order to attain the foregoing and other object of improvement, the present invention presents a method for making a semiconductor package that firstly provides a lead frame having a first surface and a corresponding second surface, and the lead frame includes at least a package unit. The package unit further includes a die pad, and a plurality of leads disposed on the periphery of the die pad where each of the leads further includes a neck portion. The method then attaches the second surface of the lead frame to a tape, and performs a punching process to cut off the neck portion of the lead so as to form a plurality of conductive blocks disposed independently on the periphery of the die pad. The method further provides a chip having its back surface attach to the first surface of the die pad, and electrical connection between the bonding pad and the first surface of the conductive block by using a plurality of bonding wires. Further, the method performs an encapsulating process to encapsulate the chip, the bonding wires, the die pad, and the first surface of the conductive block. The method then performs singulating process to separate the package unit from the lead frame. Finally the method performs a detaping process to expose the die pad and the second surface of the conductive block.

According to a preferred embodiment of the present invention, a V-shaped notch is formed beforehand on the second surface of the neck portion of the lead to facilitate the cutting off during the subsequent punching process. Besides, the lead can be designed to have an embedded structure to be embedded in the molding compound in order to avoid being separated. The embedded structure can be designed to have the area of the first surface of the lead larger than the area of the second surface of the lead such that the side surfaces become inclined planes, or to have the side surfaces form recess structure. The purpose of the design is that the first surface of the lead can be embedded in the molding compound while the second surface of the lead is exposed to the air, or the recesses can be filled by the molding compound so as to enhance the embedding effect.

Since the lead is separated from the lead frame in the previous punching process, the tool does not impact the lead frame directly during the singulating process. Therefore, the semiconductor package of the present invention can improve the integrity of the product, prolong the service life of the facilities. It can even avoid the occurrence of delaminating phenomenon, improve the moisture sensitivity level, and increase the reliability of the product.

Furthermore, in order to attain the foregoing and other objectives of improvement, the present invention also provides a lead frame structure for the process of the present invention. The lead frame structure having a first surface and a corresponding second surface includes at least a package unit. The package unit having a die pad, and a plurality of leads disposed on the periphery of the die pad further includes a neck portion wherein the width of the neck portion is smaller than the width of the other portion of the lead.

BRIEF DESCRIPTION OF DRAWINGS

The foregoing and other objectives, characteristics, and advantages of the present invention can be more fully understood by reading the following detailed description of the preferred embodiments, with reference made to the accompanying drawings as follows:

FIG. 9a through FIG. 12a is a cross-sectional view of a portion of the process for a semiconductor package of the third preferred embodiment corresponding to FIG. 9 through FIG. 12 of the present invention.

DETAILED DESCRIPTION OF PREFERRED EMBODIMENTS

Figure 3:
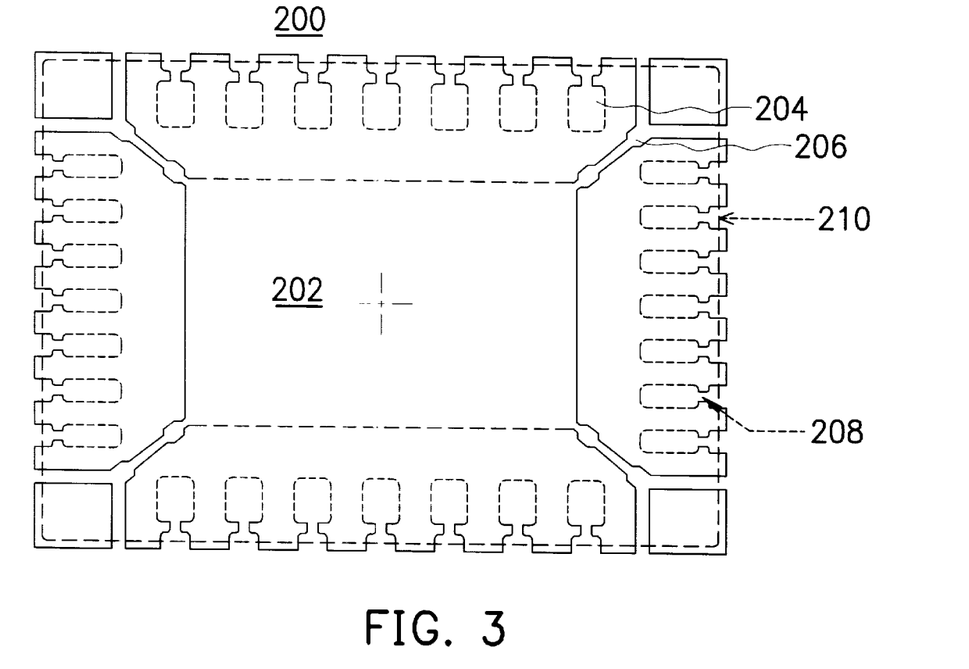
FIG. 3 is a top view of a semiconductor package of the first preferred embodiment of the present invention.

Shown in FIG. 3 is a top view of a semiconductor package of the first preferred embodiment of the present invention. The lead frame presented by the present invention is applicable to the present invention and is distinct from the conventional lead frames. A lead frame 200 is constituted by at least a package unit and can also be constituted by a plurality of package units that is disposed in strip type or array type. A single package is used for detailed description in the preferred embodiments of the present invention.

Each of the package unit includes a die pad 202, and a plurality of leads 204 disposed on the periphery of the die pad 202. The die pad 202 is fixed to the lead frame 200 by tie bars 206, and each of the lead 204 has a neck portion 208. Besides, a package outline 210 is in the encapsulating range in the subsequent encapsulating process. The width of the neck portion 208 is smaller than that of the other portion of the lead 204, and the neck portion 208 is positioned at a location adjacent to the package outline 210. The material of the lead frame 200 includes copper alloy 194, C7025, KCF125, EFTEC etc. or Nickel-Ferrite Alloy (Ni—Fe 42) wherein the surface of the alloy can be plated to form a plating layer to improve the surface characteristics such as corrosion resistance, bondability, encapsulative ability, and solderability etc.

Figure 4:
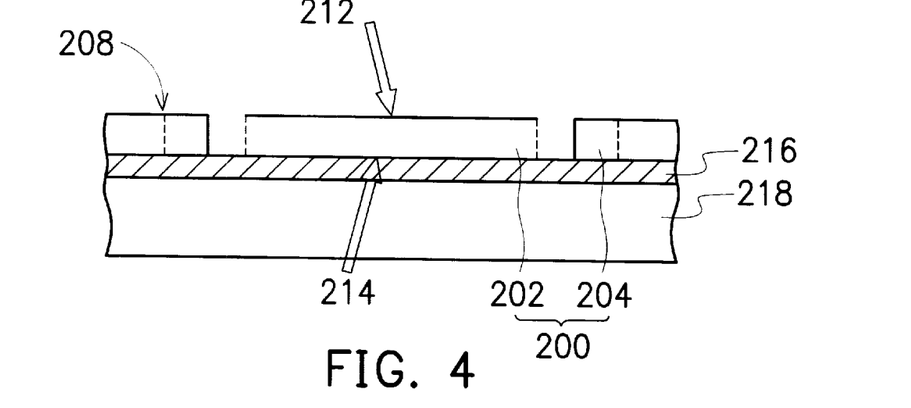
FIG. 4 through FIG. 8 is a cross-sectional view of a process for a semiconductor package of the first preferred embodiment of the present invention.

Shown in FIG. 4 through FIG. 8 is a cross-sectional view of a process for a semiconductor package of the first preferred embodiment of the present invention. As shown in FIG. 4, the lead frame 200 having the same structure as shown in the FIG. 3 further includes a first surface 212 (top surface) and a corresponding second surface 214 (bottom surface). The lead frame 200 has its second surface 214 attached to a tape 218 by the use of an adhesive 216 wherein the adhesive 216 includes silicones, acrylic silicones, thermoplastic and glues etc. while the tape 218 includes a polyimide, and a polyester etc.

Figure 5:
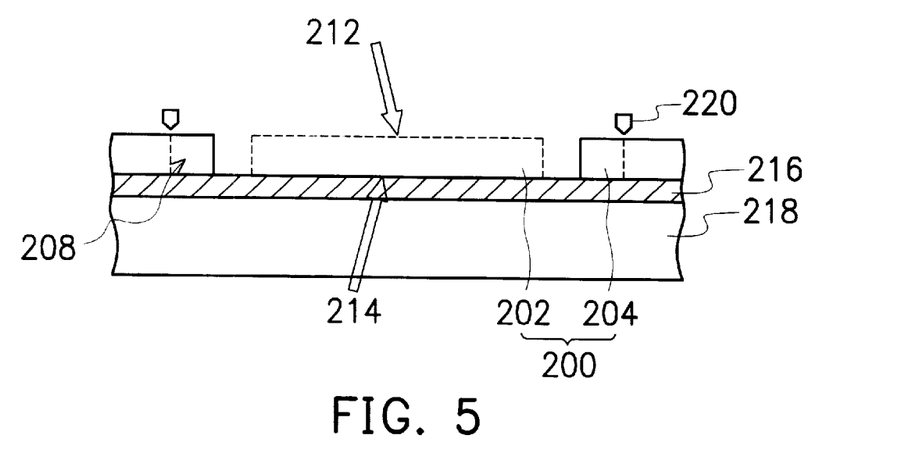
Figure 5A:
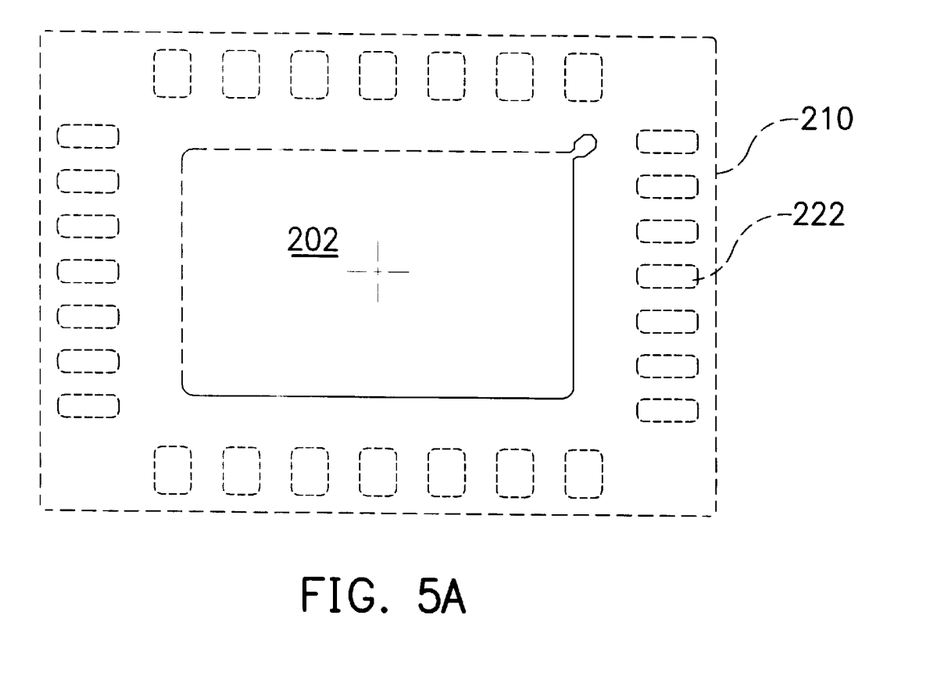
FIG. 5A is a top view of a lead frame after being punched of FIG. 5 of the first preferred embodiment of the present invention.

As shown in FIG. 5, a subsequent punching process is performed to cut off the neck portion 208 of the lead 204. For instance, the punching process is to punch the first surface 212 of the neck portion 208 of the lead 204 by a V-shaped punching head 220 so as to form a v-shaped notch. FIG. 5A shows the top view of the lead frame after the punching process where the original lead becomes an electrically conductive block 222 disposed respectively and independently on the periphery of the die pad 202 and is not connected to the lead frame 200 any more. Whether or not the tie bar 206 needed to be cut off depends upon the requirement of the process.

Figure 6:
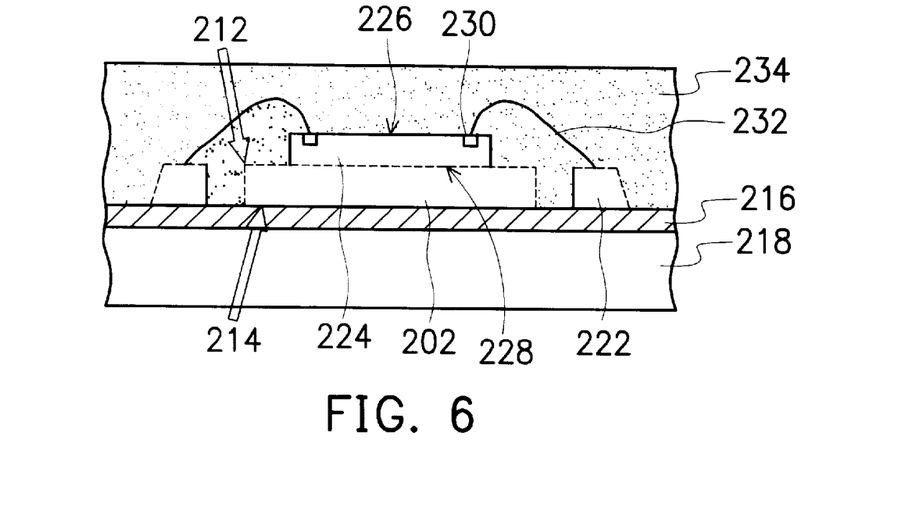

Referring to FIG. 6, subsequently, a die attaching, a wire bonding and an encapsulating process is performed. A chip 224 includes an active surface 226 and a corresponding back surface 228. The active surface 226 having a plurality of bonding pads 230 for external connections is the very surface where a device is formed from the chip 224. The chip 224 is having its back surface 228 attached to the first surface 212 of the die pad 202 by the use of an adhesive such as silver paste. A wire bonding process is then performed to electrically connect the bonding pad 230 to the conductive block 222 respectively by the use of a bonding wire 232. The bonding wire 232 is connected to the first surface 212 of the conductive block 222, and the material of the bonding wire 232 includes gold and aluminum etc. Subsequently, an encapsulating process is performed by using a molding compound 234 to encapsulate the chip 224, the bonding wire 232, the die pad 202, and the first surface 212 of the conductive block 222 wherein the molding compound 234 includes epoxy for example.

Figure 7:
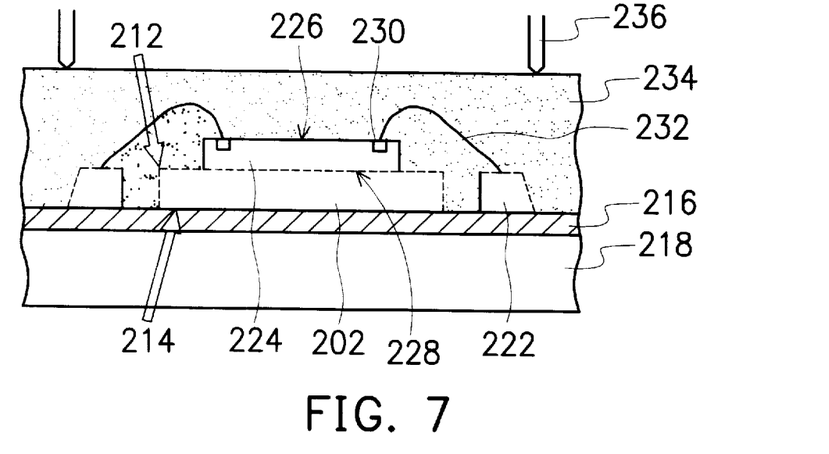

Referring to FIG. 7, a singulating process is performed to separate each package unit from the lead frame 200 by the use of a saw 236 or a punching head 220. The singulating process is to make it become a single semiconductor package and in the same time to remove the unnecessary molding compound other than the conductive block 222. Normally a lead frame is formed by a plurality of package units either in strip type or in array type. What is worth while to mention is that when it comes to packaging, the lead frame can be performed a packaging process by encapsulating a single package unit or by encapsulating several package units together. It can then be unified through a separating process. Since the leads are separated from the lead frame in the previous punching process, thereby, the tool or the punching head can not directly impact the lead frame, therefore, the integrity of the product can be maintained and the tool life can be prolonged. Even to the extent that it can avoid the delaminating phenomena occurred between the leads and the molding compound due to the impact, thereby, the moisture sensitivity level of the product can be improved and the reliability of the product can be increased.

Figure 8:
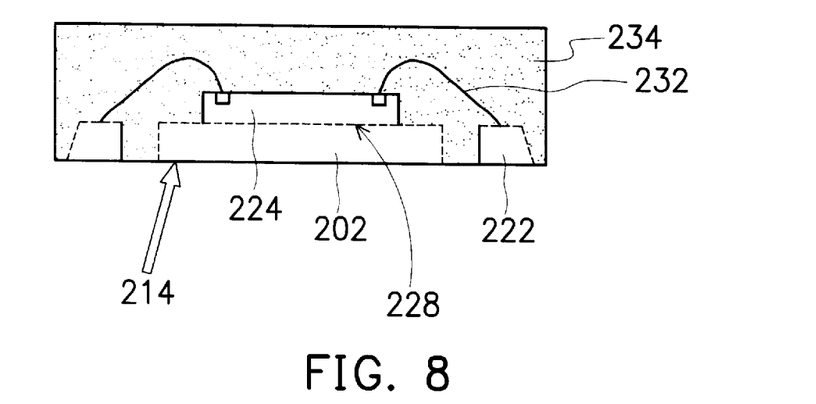

Referring to FIG. 8, a detaping process is performed to remove the tape 218 so as to expose the die pad 202 and the second surface 214 of the conductive block 222 for making them the external connections of the semiconductor package.

Figure 9:
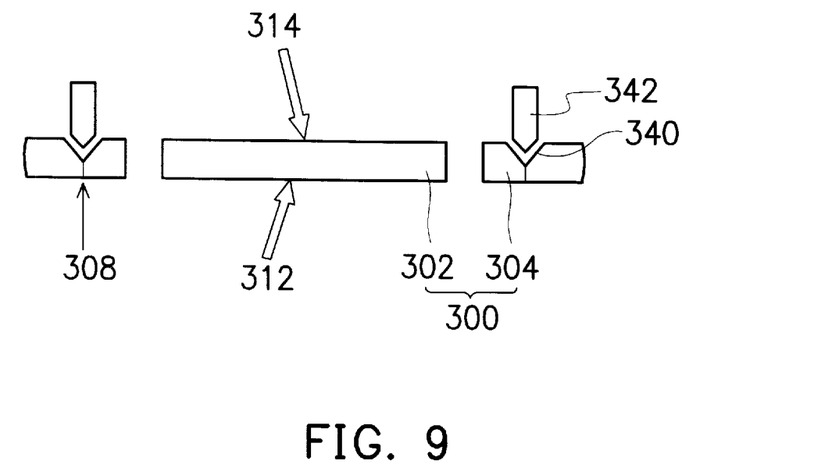
FIG. 9 through FIG. 12 is a cross-sectional view of a portion of the process for a semiconductor package of the second preferred embodiment of the present invention.
Figure 9A:
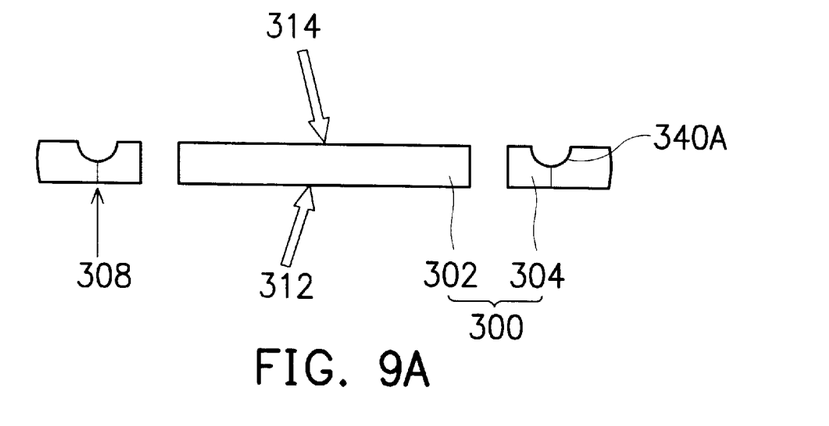

In order to facilitate the working and to enhance the bondability between the leads and the molding compound, the present invention presents another process for a semiconductor package that is illustrated in a second embodiment of the present invention. Shown in FIG. 9 through FIG. 12 is a cross-sectional view of a portion of the process for a semiconductor package of the second preferred embodiment of the present invention. While FIG. 9a through FIG. 12a is a cross-sectional view of a portion of the process for a semiconductor package of the third preferred embodiment corresponding to FIG. 9 through FIG. 12 of the present invention. As shown in FIG. 9, the lead frame structure 300 in the present embodiment is similar to that of the one shown in FIG. 3. Each of the package unit includes also a die pad 302 and a plurality of leads 304 disposed on the periphery of the die pad 302. The difference is that a V-shaped notch 340 having the dimension of a depth smaller than the dimension of the thickness of the leads 304 is formed at the neck portion 308 of the leads 304 on the second surface 314 before the lead frame 300 is attached to the tape. The V-shaped notch 340 can be formed, for instance, by the use of punching method to punch the second surface 314 of the neck portion 308 by the punching head 342. As shown also in FIG. 9A, in addition to the punching method, a half-etching method can also be employed to form a notch 340A in the shape of an approximate semicircle at the neck portion 308 of the lead 304 on the second surface 314.

Figure 10:
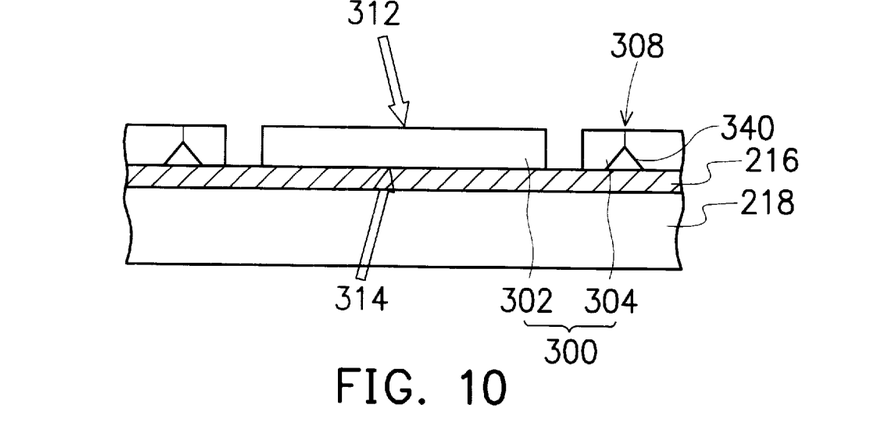
Figure 10A:
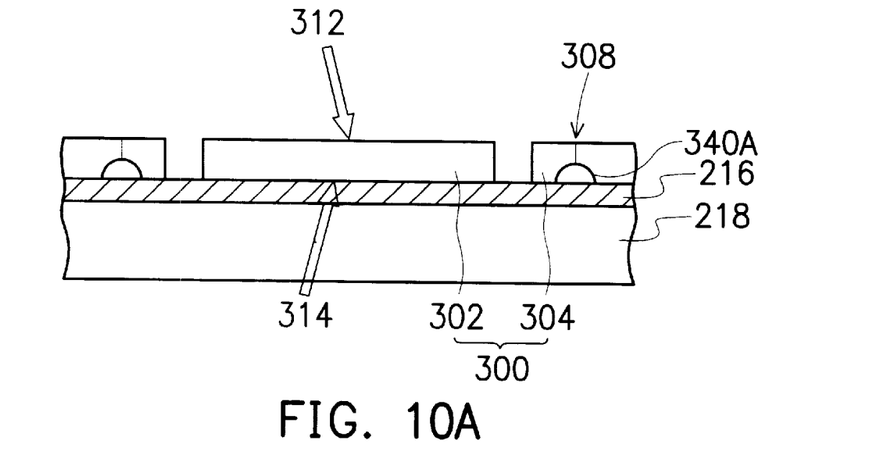
Figure 11:
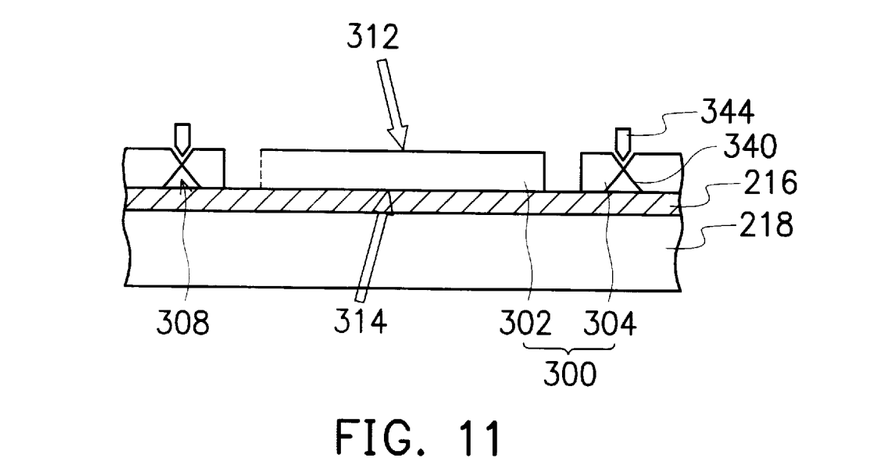
Figure 11A:
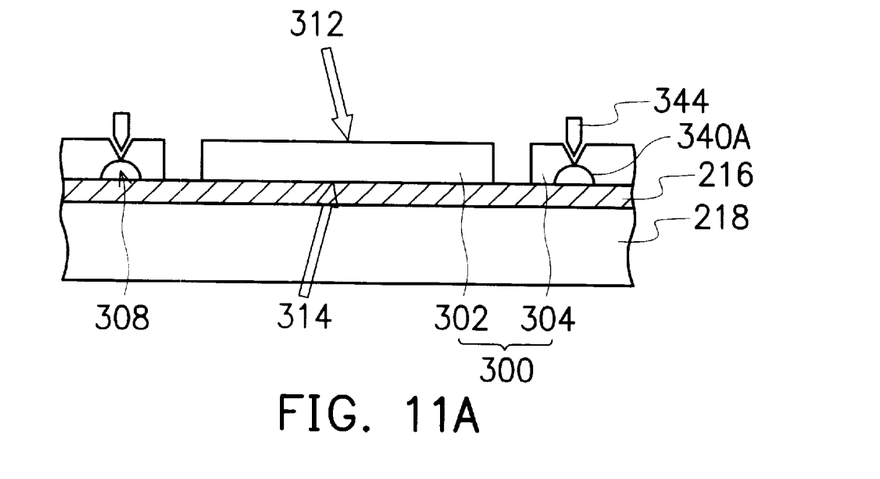
Figure 12:
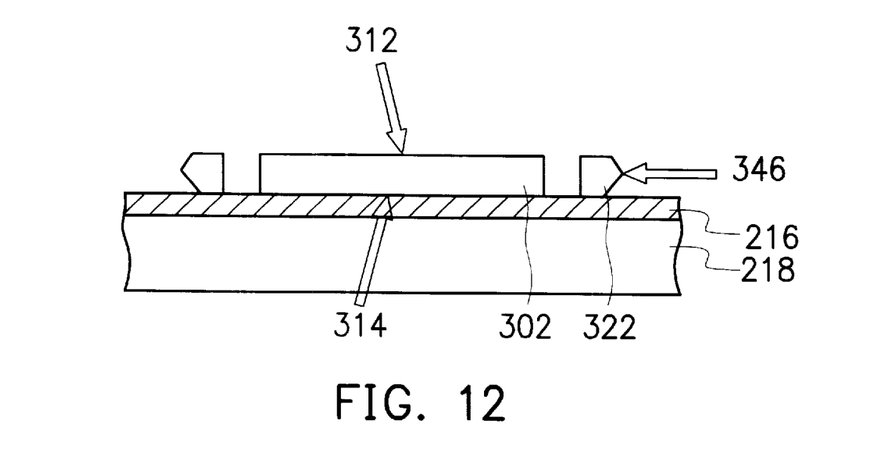
Figure 12A:
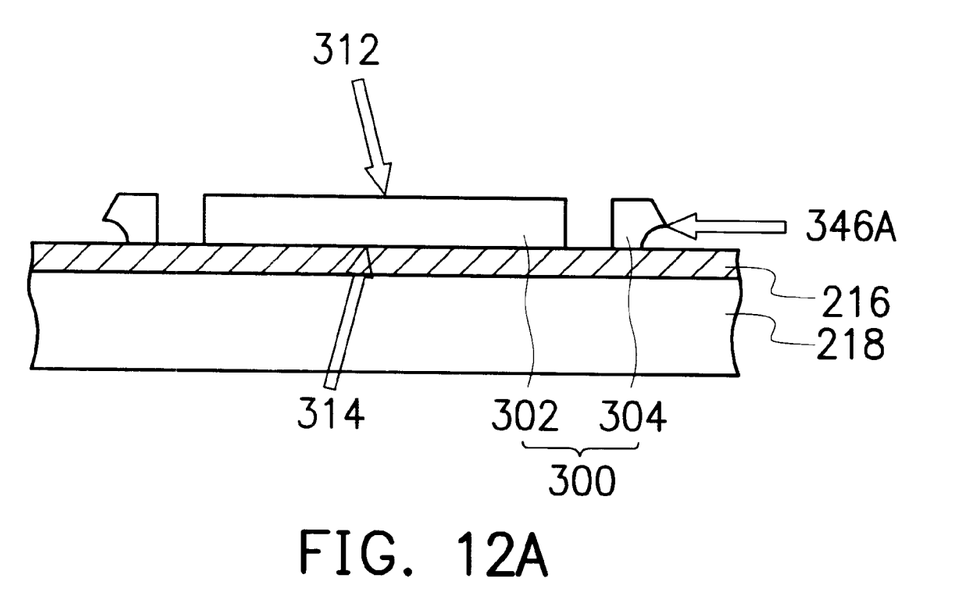

Similarly, the lead frame 300 is having its second surface 314 attached to the tape 218 by the adhesive 216 as shown in FIG. 10 and FIG. 10A. Referring to FIG. 11 and FIG. 11A, a punching process is performed. A punching head 344 is used to punch the first surface 312 of the neck portion 308 of the leads 304 in order to cut off the neck portion 308 to form the conductive blocks 322, 322A as shown in FIG. 12 or FIG. 12A. As for the other subsequent processes such as chip attachment, wire bonding, packaging, singulating, and detaping processes are similar to the ones in the first embodiment, thereby, they are not going to be depicted here.

Since the neck portion 308 of the leads 304 is punched and cut off through two punching processes or a half-etching process, bump embedding structures 346, 346A are formed on the side surfaces of the conductive blocks 322, 322A. This bump embedding structure 346 can improve the embedding effect between the leads and the molding compound, thereby, can increase the reliability of the product. Besides, this kind of process can provide a better workability for those lead frames having relatively large dimension in thickness.

In addition, in order to enhance the embedding effect between the leads and the molding compound, a variety of lead design can be chosen as described as follows.

Figure 13:
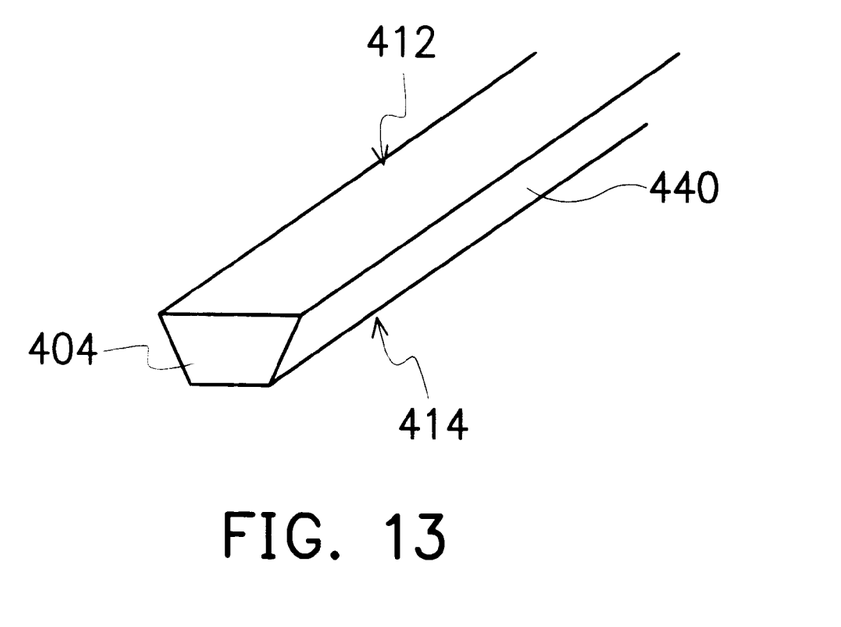
FIG. 13 is an isometric view of a lead structure of a semiconductor package of the present invention.

Showing in FIG. 13 is an isometric view of a lead structure of a semiconductor package of the present invention. The area of the first surface 412 of the lead 404 can be designed to be larger than the area of the second surface 414 to make the side surface 440 of the lead 404 become an inclined plane structure. When it comes to encapsulating, the first surface 412 having relatively large area is embedded into the molding compound while the second surface 414 is exposed to the air. By doing this, the embedding effect between leads and the molding compound can be enhanced.

Figure 14:
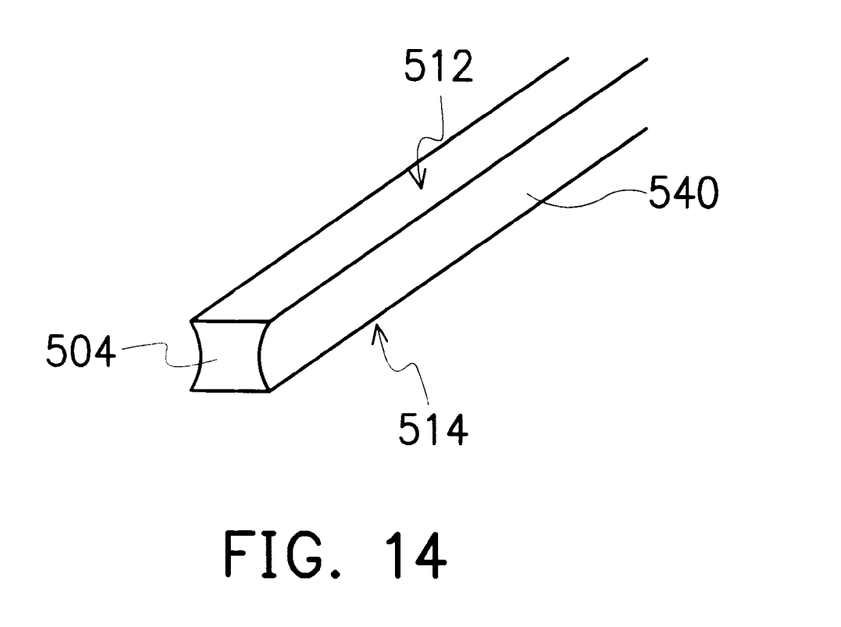
FIG. 14 is an isometric view of another lead structure of a semiconductor package of the present invention.

Moreover, Showing in FIG. 14 is an isometric view of a lead structure of another semiconductor package of the present invention. In addition to the design having different surface areas of the first surface 512 and the second surface 514 of the lead 504 as previously illustrated, a recess structure can be formed on both the side surfaces. In this way, the molding compound can fill the recesses on the side surface 540 to enhance the embedding effect between leads and the molding compound.

Figure 15:
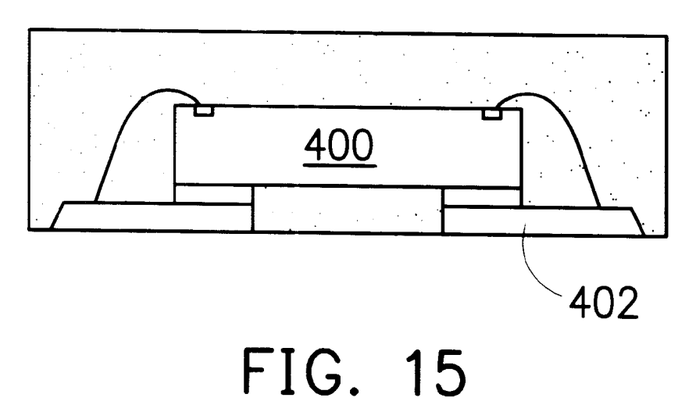
FIG. 15 and FIG. 16 are the cross-sectional views of a nolead semiconductor package structure without die pad.
Figure 16:
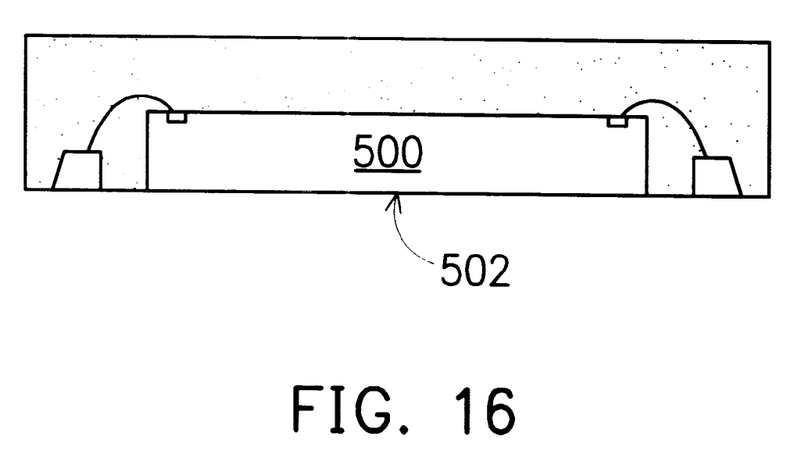

Besides, all the lead frames in the above-mentioned embodiments are structures with die pad wherein the area of the die pad can be smaller than the area of the chip. However, showing in FIG. 15 and FIG. 16 are the nolead semiconductor package structures without die pad of the present invention. The die pad is not a necessity in the present invention. As shown in FIG. 15, the chip 400 can be attached directly on the leads 402 to form a "Chip on Lead" (COL) structure. Moreover, as shown in FIG. 16, the chip can also be attached directly on a tape in a chip attaching process, and in the subsequent detaping process, be directly exposed the back surface 502 of the chip 500. In this way, the package of the present invention can enhance the heat-dissipating effect further. What is more, if a "flip chip method" of attachment is employed between the chip and the leads, there is no need to have a "die pad" in the package.

To summarize the foregoing illustration disclosed by preferred embodiments of the present invention, the semiconductor package of the present invention includes at least the following advantages:

1. The semiconductor package of the present invention can improve the integrity of the product since the tool does not impact the lead frame directly during the singulating process.
2. The semiconductor package of the present invention can prolong the service life of the facilities, and can facilitate the mass production of the product since the tool does not impact the lead frame directly during the singulating process.
3. The semiconductor package of the present invention can avoid the delaminating phenomenon occurred between the leads and the molding compound, and thereby, can improve the moisture sensitivity level and increase the reliability of the product since the tool does not impact the lead frame directly during the singulating process.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for making a semiconductor package comprising:
    providing a leadframe having a first surface and a corresponding second surface, wherein the leadframe includes at least a package unit that includes a plurality of leads, and each of the lead includes a neck portion;
    attaching the second surface of the leadframe to a tape;
    performing a punching process to cut off the leads at the neck portion location so as to form a plurality of conductive blocks;
    providing a chip having an active surface and a corresponding back surface, wherein the active surface has a plurality of bonding pads, and the chip has its back surface attached to the tape;
    providing electrical connection between the bonding pads and the first surface of the conductive blocks by using a plurality of bonding wires;
    performing an encapsulating process to encapsulate the chip, the bonding wires, and the first surfaces of the conductive blocks;
    performing a singulating process to separate the package units from the leadframe; and
    performing a detaping process to expose the second surface of the conductive blocks.

2. The process for making the semiconductor package of claim 1 wherein the lead frame further comprises a die pad, and the chip has its back surface attached to the die pad for fixing to the tape.

3. The process for making the semiconductor package of claim 1 wherein the area of the first surface of each conductive block is larger than the area of the corresponding second surface of the conductive block.

4. The process for making the semiconductor package of claim 1 wherein the side surfaces of each conductive block further comprises a recess structure.

5. The process for making the semiconductor package of claim 1 wherein the neck portion of each lead forms a V-shaped notch on the first surface of the lead during the punching process.

6. The process for making the semiconductor package of claim 1 wherein the singulating process further comprises separating the molding compound on the outer edge of the conductive blocks.

7. The process for making the semiconductor package of claim 1 wherein the lead frame is constituted by a plurality of package units disposed in strip type.

8. The process for making the semiconductor package of claim 1 wherein the lead frame is constituted by a plurality of package units disposed in array type.

9. A method for making a semiconductor package comprising:
   providing a leadframe having a first surface and a corresponding second surface, wherein the leadframe includes at least a package unit that includes a plurality of leads, and each of the leads includes a neck portion, and the second surface at the location of the neck portion includes a V-shaped notch;
   attaching the second surface of the leadframe to a tape;
   performing a punching process on the first surface at the location opposite to the V-shaped notch to cut off the leads at the neck portion location so as to form a plurality of conductive blocks;
   providing a chip having an active surface and a corresponding back surface, wherein the active surface has a plurality of bonding pads, and the chip has its back surface attached to the tape;
   providing electrical connection between the bonding pads and the first surface of the conductive blocks by using a plurality of bonding wires;
   performing an encapsulating process to encapsulate the chip, the bonding wires and the first surfaces of the conductive blocks;
   performing a singulating process to separate the package unit from the leadframe; and performing a detaping process to expose the second surface of the conductive blocks.

10. The process for making the semiconductor package of claim 9 wherein the lead frame further comprises a die pad, and the chip has its back surface attached to the die pad for fixing to the tape.

11. The process for making the semiconductor package of claim 9 wherein the area of the first surface of each conductive block is larger than the area of the corresponding second surface of the conductive block.

12. The process for making the semiconductor package of claim 9 wherein the side surfaces of each conductive block further comprises a recess structure.

13. The process for making the semiconductor package of claim 9 wherein the neck portion of each lead forms a V-shaped notch on the first surface of the lead during the punching process.

14. The process for making the semiconductor package of claim 9 wherein the notch of each lead appears in V-shape formed by another punching process, and the depth of the notch is smaller than the thickness of the lead.

15. The process for making the semiconductor package of claim 9 wherein the notch of each lead appears approximately in the shape of a semicircle formed by a half-etching process, and the depth of the notch is smaller than the thickness of the lead.

16. The process for making the semiconductor package of claim 9 wherein the singulating process further comprises separating the molding compound on the outer edge of the conductive blocks.

17. The process for making the semiconductor package of claim 9 wherein the lead frame is constituted by a plurality of package units disposed in strip type.

18. The process for making the semiconductor package of claim 8 wherein the lead frame is constituted by a plurality of package units disposed in array type.

19. A method for making a semiconductor package comprising:
   providing a leadframe having a first surface and a corresponding second surface wherein the leadframe includes a plurality of leads, each of the leads having a neck portion, and the second surface at the location of the neck portion including a V-shaped notch;
   attaching the second surface of the leadframe to a tape;
   performing a punching process on the first surface at the location opposite to the V-shaped notch to cut off the leads at the neck portion location so as to form a plurality of conductive blocks;
   providing a chip having an active surface and a corresponding back surface, wherein the active surface has a plurality of bonding pads, and the chip has its back surface attached to the tape;
   providing electrical connection between the bonding pads and the first surface of the conductive blocks by using a plurality of bonding wires;
   performing an encapsulating process to encapsulate the chip, the bonding wires and the first surfaces of the conductive blocks; and
   performing a detaping process to expose the second surface of the conductive blocks.

20. A method for making a semiconductor package comprising:
   providing a leadframe having a first surface and a corresponding second surface, wherein the leadframe includes a plurality of leads, each of the lead having a neck portion;
   attaching the second surface of the leadframe to a tape;
   performing a punching process to cut off the leads at the neck portion location so as to form a plurality of conductive blocks;
   providing a chip having an active surface and a corresponding back surface, wherein the active surface has a plurality of bonding pads, and the chip has its back surface attached to the tape;
   providing electrical connection between the bonding pads and the first surface of the conductive blocks by using a plurality of bonding wires;
   performing an encapsulating process to encapsulate the chip, the bonding wires, and the first surfaces of the conductive blocks; and
   performing a detaping process to expose the second surface of the conductive blocks.

* * * * *

UNITED STATES PATENT AND TRADEMARK OFFICE
CERTIFICATE OF CORRECTION

PATENT NO. : 6,355,502 B1 Page 1 of 1
APPLICATION NO. : 09/557344
DATED : March 12, 2002
INVENTOR(S) : Kun-A Kang et al.

It is certified that error appears in the above-identified patent and that said Letters Patent is hereby corrected as shown below:

Title Page,

Item [73], Assignee: [National Science Council] --Advanced Semiconductor Engineering Inc. --

Signed and Sealed this

Sixth Day of March, 2007

JON W. DUDAS
*Director of the United States Patent and Trademark Office*